United States Patent
Takeuchi

(10) Patent No.: US 8,101,324 B2
(45) Date of Patent: Jan. 24, 2012

(54) PHOTOMASK MANUFACTURING METHOD, PHOTOMASK MANUFACTURING APPARATUS AND PHOTOMASK

(75) Inventor: Kanji Takeuchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 110 days.

(21) Appl. No.: 12/330,734

(22) Filed: Dec. 9, 2008

(65) Prior Publication Data
US 2009/0202923 A1     Aug. 13, 2009

(30) Foreign Application Priority Data
Feb. 7, 2008 (JP) .................................. 2008-028055

(51) Int. Cl.
    *G03F 1/00*      (2006.01)
(52) U.S. Cl. ........................................... 430/5; 430/394
(58) Field of Classification Search .............. 430/5, 311, 430/394; 716/19, 21
See application file for complete search history.

(56) References Cited

U.S. PATENT DOCUMENTS

| | | | | |
|---|---|---|---|---|
| 2001/0005566 A1* | 6/2001 | Kotani et al. | ..................... | 430/5 |
| 2002/0066069 A1* | 5/2002 | Ashida et al. | ................... | 716/19 |
| 2006/0129968 A1* | 6/2006 | Pierrat | ........................... | 716/21 |
| 2007/0124718 A1* | 5/2007 | Kobayashi et al. | ............. | 716/19 |
| 2008/0113280 A1* | 5/2008 | Osawa et al. | ..................... | 430/5 |

FOREIGN PATENT DOCUMENTS

| | | |
|---|---|---|
| JP | 10-123692 A | 5/1998 |
| JP | 11-202475 A | 7/1999 |
| JP | 2003-17390 A | 1/2003 |

* cited by examiner

*Primary Examiner* — Mark F Huff
*Assistant Examiner* — Rashid Alam
(74) *Attorney, Agent, or Firm* — Westerman, Hattori, Daniels & Adrian, LLP

(57) ABSTRACT

A photomask manufacturing method which includes generating data of a main pattern to be transferred onto a substrate, and data of an assist pattern which is arranged adjacent to the main pattern and which assists the transfer of the main pattern without being transferred onto the substrate; performing an optical proximity effect correction to the generated data of the main pattern; correcting shapes of the main pattern and the assist pattern on the basis of a shape change caused at an edge of the main pattern facing the assist pattern by the optical proximity effect correction; and forming a photomask by using the data of the main pattern and of the assist pattern which have been corrected.

5 Claims, 15 Drawing Sheets

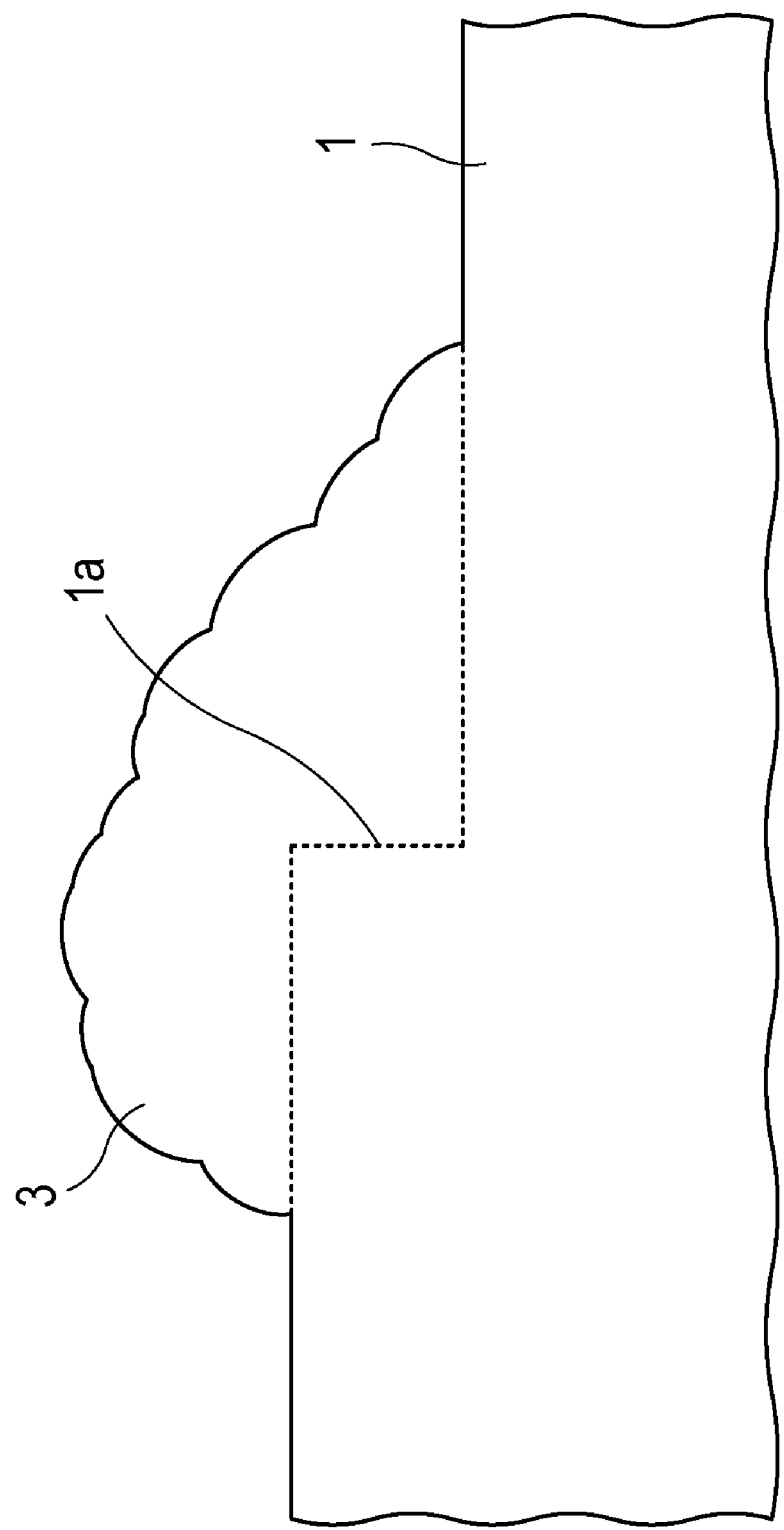

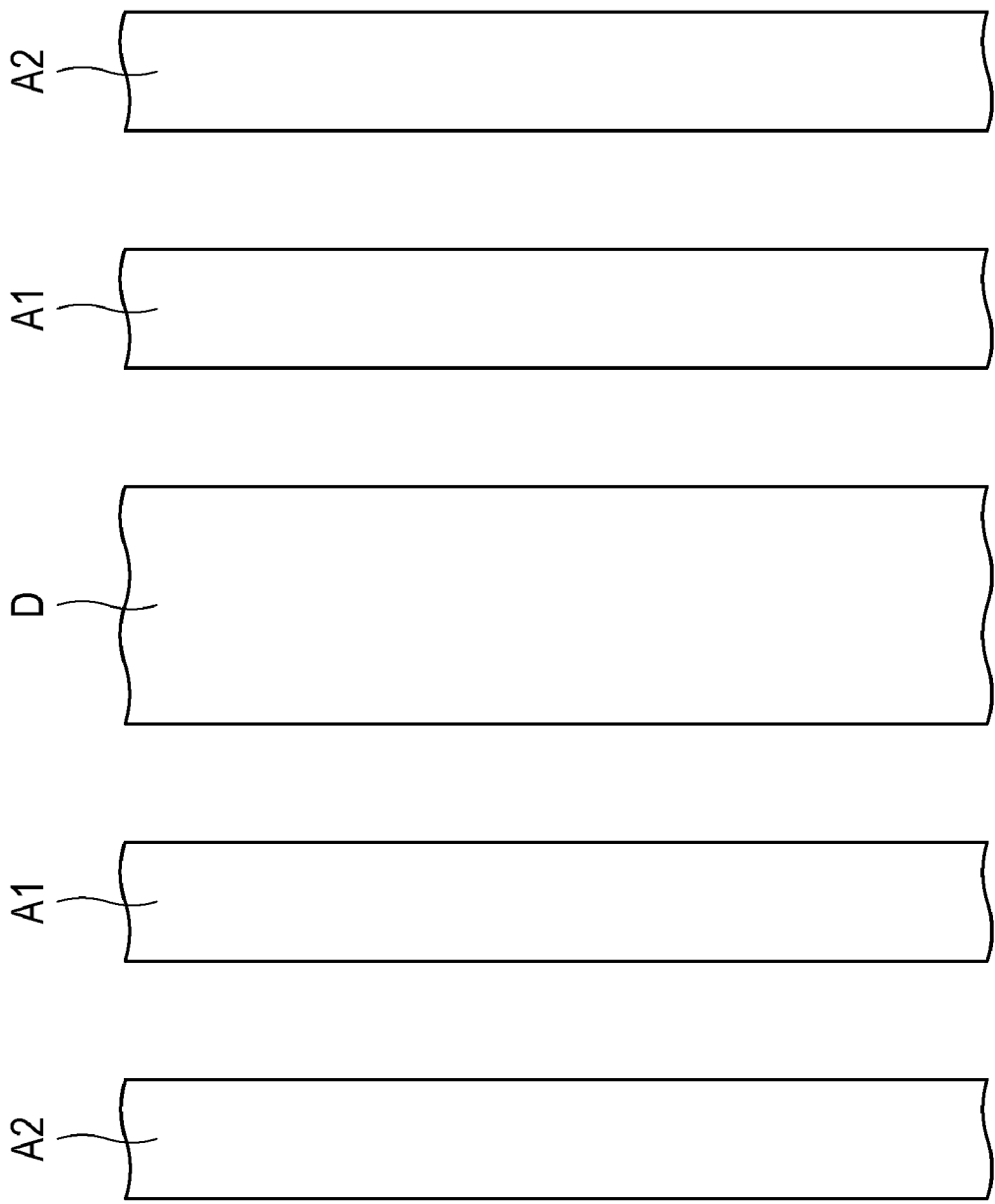

FIG. 9

| LEVEL DIFFERENCE | MOVEMENT AMOUNT OF EDGE POSITION D IN THE DIRECTION TOWARD A1 s | CHANGE AMOUNT OF LINE WIDTH OF A1 u | MOVEMENT AMOUNT OF EDGE POSITION D IN THE DIRECTION AWAY FROM A1 t | CHANGE AMOUNT OF LINE WIDTH OF A1 v |
|---|---|---|---|---|
| 5 nm OR MORE | 0 nm | 0 nm | 0 nm | 0 nm |
| 4 nm | 3 nm | -36 nm | 1 nm | +10 nm |
| 3 nm | 2 nm | -24 nm | 1 nm | +10 nm |
| 2 nm | 1 nm | -12 nm | 1 nm | +10 nm |
| 1 nm | 1 nm | 0 nm | 0 nm | 0 nm |

PHOTOMASK MANUFACTURING METHOD, PHOTOMASK MANUFACTURING APPARATUS AND PHOTOMASK

CROSS-REFERENCE TO RELATED APPLICATION

This application is based upon and claims the benefit of priority from the prior Japanese Patent Application No. 2008-28055 filed on Feb. 7, 2008, the entire contents of which are incorporated herein by reference.

BACKGROUND

1. Field

The present invention relates to a photomask manufacturing method, a photomask manufacturing apparatus, and a photomask.

2. Description of the Related Art

In recent years, in the manufacturing of a semiconductor integrated circuit device and a magnetic element, such as a magnetic head, it is required to form a very fine pattern. In connection with this requirement, various micro-fabrication techniques have been proposed.

In the case where a fine device pattern is intended to be formed on a wafer by exposure, it is necessary to use short wavelength light and an optical system having a large numerical aperture. The optical system having the large numerical aperture has a shallow depth of focus. Therefore, in the case where such an optical system is used, and a desired fine device pattern is intended to be formed on a wafer, it is necessary precisely maintain focusing for the whole surface of the wafer. However, there is slight unevenness inevitably formed on a wafer surface, and hence it is difficult to maintain such precise focusing for the whole surface of the wafer. This problem markedly appears in particular when an isolated device pattern is intended to be exposed.

When in order to form a device pattern with high dimensional accuracy on a wafer, an optical proximity effect correction (hereinafter referred to as OPC) is applied to the device pattern on a photomask, many minute level differences of several nanometers are planarly formed at the edge of a device pattern of a photomask. When the device pattern of the photomask is formed into a shape having the many minute level differences, a device pattern of a desired dimension can be formed on the wafer in combination with the effect by an assist pattern.

When many minute level differences exist at the edge of the device pattern of the photomask, correction accuracy of a defect caused at the edge of the device pattern needs to be improved in order to form the photomask. However, for example, in the case where a defect is caused at the level difference portion existing at the edge of the device pattern of the photomask, it is very difficult to correct such portion into an originally expected level difference shape, as compared with the case where a defect caused in a linear portion with no such level difference is corrected. Further, it is also difficult to check with high accuracy whether or not the correction performed to such level difference portion is appropriately reflected in the device pattern formed on the wafer.

SUMMARY

According to an aspect of the present embodiment, a photomask manufacturing method includes: generating data of a main pattern to be transferred onto a substrate, and data of an assist pattern which is arranged adjacent to the main pattern and which assists the transfer of the main pattern without being transferred onto the substrate; performing an optical proximity effect correction to the generated data of the main pattern; correcting shapes of the main pattern and the assist pattern on the basis of a shape change caused at an edge of the main pattern facing the assist pattern by the optical proximity effect correction; and forming a photomask by using the data of the main pattern and of the assist pattern which have been corrected.

BRIEF DESCRIPTION OF THE DRAWINGS

FIG. 1A shows a state before OPC, FIG. 1B shows a state after the OPC, and FIG. 1C shows a state after the shape correction;

FIG. 2 shows an example of a defect generated on a photomask;

FIG. 3 shows an arrangement example of a device pattern and an assist pattern on a photomask;

FIG. 9 shows an example of a correction table;

FIG. 13A shows data of the device pattern after the OPC and data of the assist pattern, and FIG. 13B shows a result of optical simulation of FIG. 13A;

FIG. 14A shows data of the device pattern and data of the assist pattern after the shape correction, and FIG. 14B shows a result of optical simulation of FIG. 14A.

DESCRIPTION OF THE PREFERRED EMBODIMENTS

In the following, embodiments according to the present invention will be described with reference to the accompanying drawings. First, there will be described an outline of shape correction performed for a device pattern and an assist pattern of a photomask.

Figure 1A:
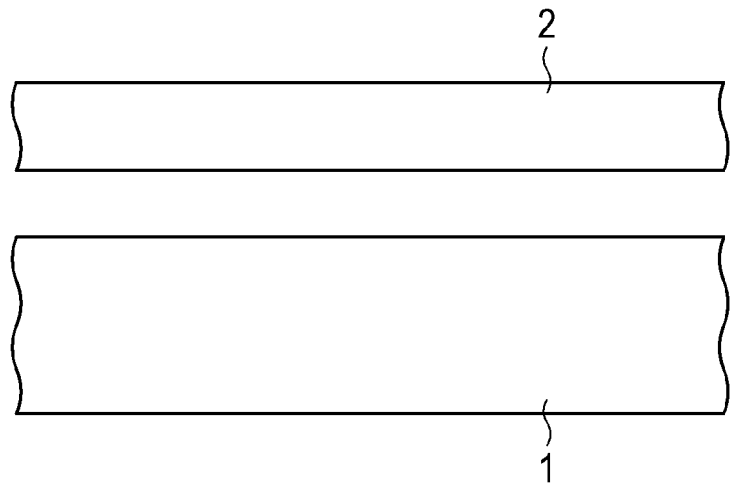
FIG. 1A to FIG. 1C are figures for explaining a flow of shape correction of a device pattern and a assist pattern of a photomask, in which figures
Figure 1B:
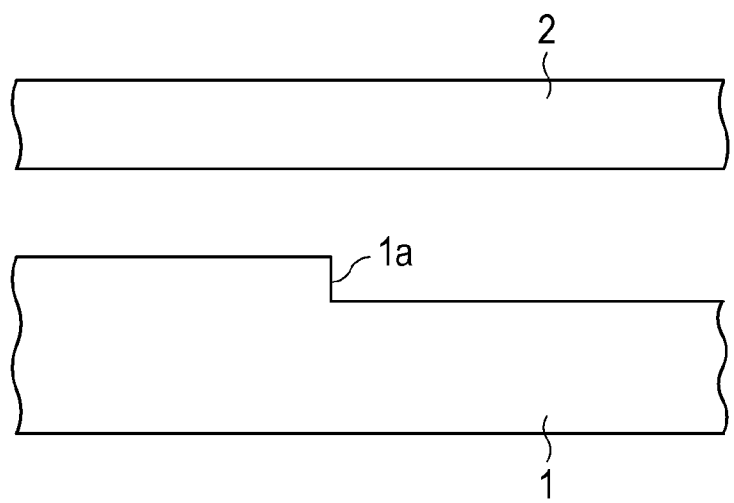
Figure 1C:
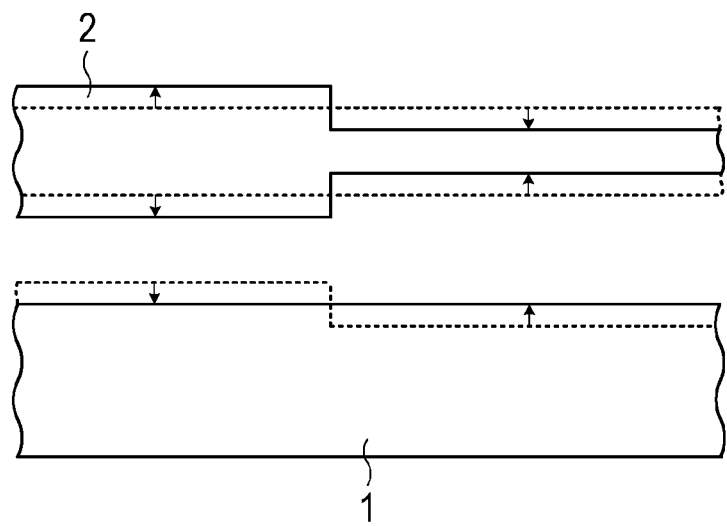

FIG. 1A to FIG. 1C are figures for explaining a flow of shape correction of a device pattern and an assist pattern of a photomask, in which figures FIG. 1A shows a state before OPC, FIG. 1B shows a state after the OPC, and FIG. 1C shows a state after the shape correction. Further, FIG. 2 shows an example of a defect generated on the photomask.

As shown in FIG. 1A, there are arranged on the photomask a device pattern 1 to be transferred onto a wafer, and an assist pattern 2 which is arranged adjacent to the device pattern 1, so as to assist the transfer of the device pattern 1. The assist pattern 2 is formed with a dimension (line width) so as not to be transferred onto the wafer.

The OPC is usually applied to the device pattern 1 among the device pattern 1 and the assist patterns 2 as shown in FIG. 1A. At the edge of the device pattern 1 after the OPC, a level difference 1a is formed as shown in FIG. 1B, because of the shape of the device pattern itself, an arrangement relation between the device pattern and the other device pattern (not shown), and the like. When a wafer is actually exposed by using a photomask on which the device pattern 1 having such level difference 1a is formed, a device pattern having a linear edge shape is transferred onto the wafer.

However, in the case where a defect 3 is fored at the level difference 1a in the forming stage of the photomask as shown in FIG. 2, it is necessary to perform a correction so as to reproduce the level difference 1a at the edge of the device pattern 1 by removing the defect 3. However, the correction for the device pattern 1 needs to be extremely accurately performed in order to secure the desired transfer shape on the wafer. In the case where a number of such level differences 1a formed on the photomask by the OPC, the frequency at which such extremely accurate correction is performed is also increased.

Thus, the shape of the assist pattern 2 arranged adjacent to the device pattern 1 is changed, so as to thereby eliminate the level difference 1a of the device pattern 1 formed by the OPC. Also, when a number of the level differences 1a are formed, these level differences 1a are reduced by changing the shape of the assist pattern 2.

That is, for example, as shown in FIG. 1C, the level difference 1a existing at the edges of the device pattern 1 (as shown by dotted lines in the figure) is eliminated by moving the position of the edges (as shown by arrows in the figure) so that the portion at which the level difference 1a exists is made into a linear shape. Then, the line width of the portion of the assist pattern 2 facing the portion of the device pattern 1 (the line width of which portion is reduced by such movement of the edge position) is increased symmetrically on both sides, and the line width of the portion of the assist pattern 2 facing the portion of the device pattern 1 (the line width of which portion is increased) is reduced symmetrically on both sides (as shown by arrows in the figure). The correction amount in the case of such shape correction (the movement amount of the edge position of the device pattern 1 and the change amount of the line width of the assist pattern 2) are respectively set so as to make it possible, when exposure is performed by using the photomask on which the pattern after the shape correction is formed, to obtain a transfer shape equivalent to the transfer shape obtained by using the photomask on which the pattern after the OPC (before the shape correction) as shown in FIG. 1B is formed. A relationship between the movement amount of the edge position of the device pattern 1 and the change amount of the line width of the assist pattern 2 is acquired beforehand.

In this way, the effect of the level difference 1a of the device pattern 1, which level difference is formed by the OPC, on the transfer shape on the wafer is realized by the device pattern 1 whose level difference 1a is eliminated, and by the assist pattern 2 whose line width is changed on the basis of the edge position movement amount corresponding to the elimination of the level difference 1a. Thereby, it is possible to suppress the generation of the defect 3 which needs to be highly accurately corrected. For example, even in the case where a defect is generated at the edge of the device pattern 1, when the edge is made into a linear shape, it is only necessary to perform correction to remove the defect along the linear edge, so that the defect correction can be facilitated. Further, even when a defect exists at the edge of the assist pattern 2 whose line width is changed, the correction accuracy is not so much required as in the case of the device pattern, as will be describe below.

Subsequently, there will be described in detail the principle of the above described shape correction of the device pattern and the assist pattern of the photomask.

FIG. 3 is a figure showing an arrangement example of a device pattern and an assist pattern on a photomask.

FIG. 3 exemplifies a case where on both sides sandwiching a linear device pattern D to be transferred onto a wafer, two linear assist patterns A1 are arranged adjacent to the device pattern D, and where two linear assist patterns A2 are further arranged on the outside of the two linear assist patterns A1, respectively. Here, it is assumed that the line width of the device pattern D is 80 nm, and that the line width of each of the assist patterns A1 and A2 is 40 nm.

Figure 4:
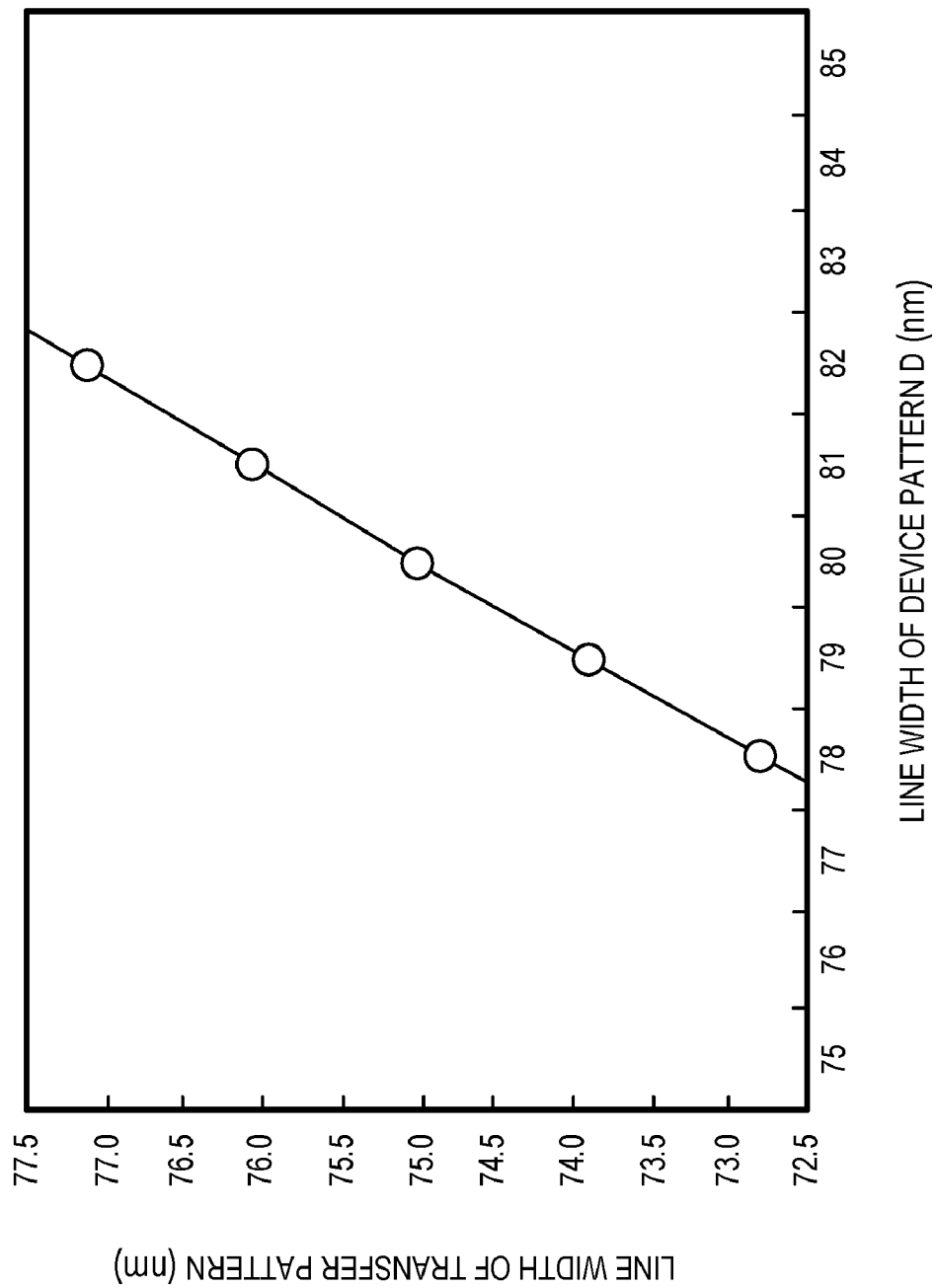
FIG. 4 shows a relationship between the line width of the device pattern D and the line width of a transfer pattern.
Figure 5:
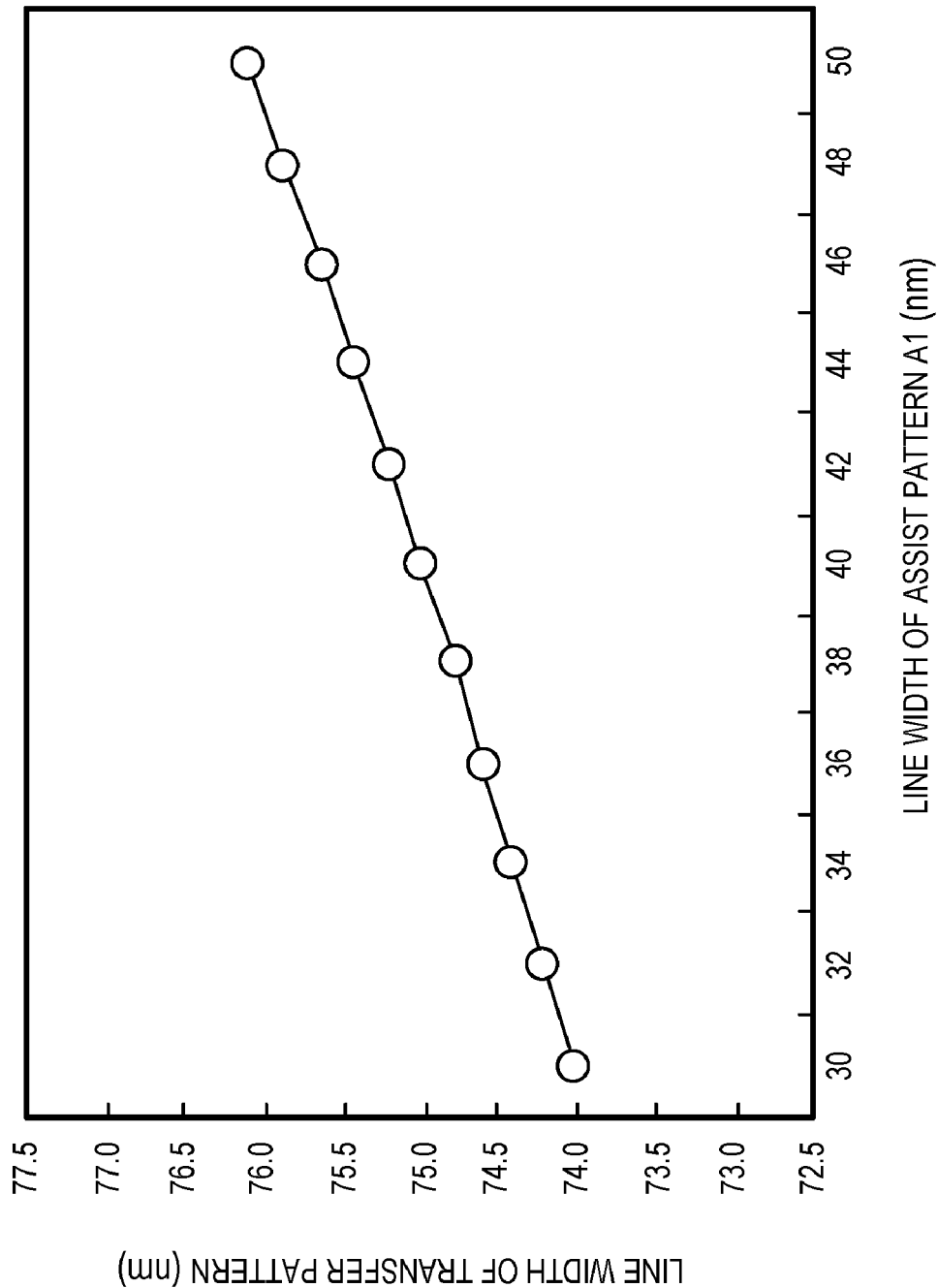
FIG. 5 shows a relationship between the line width of the assist pattern A1 and the line width of the transfer pattern.
Figure 6:
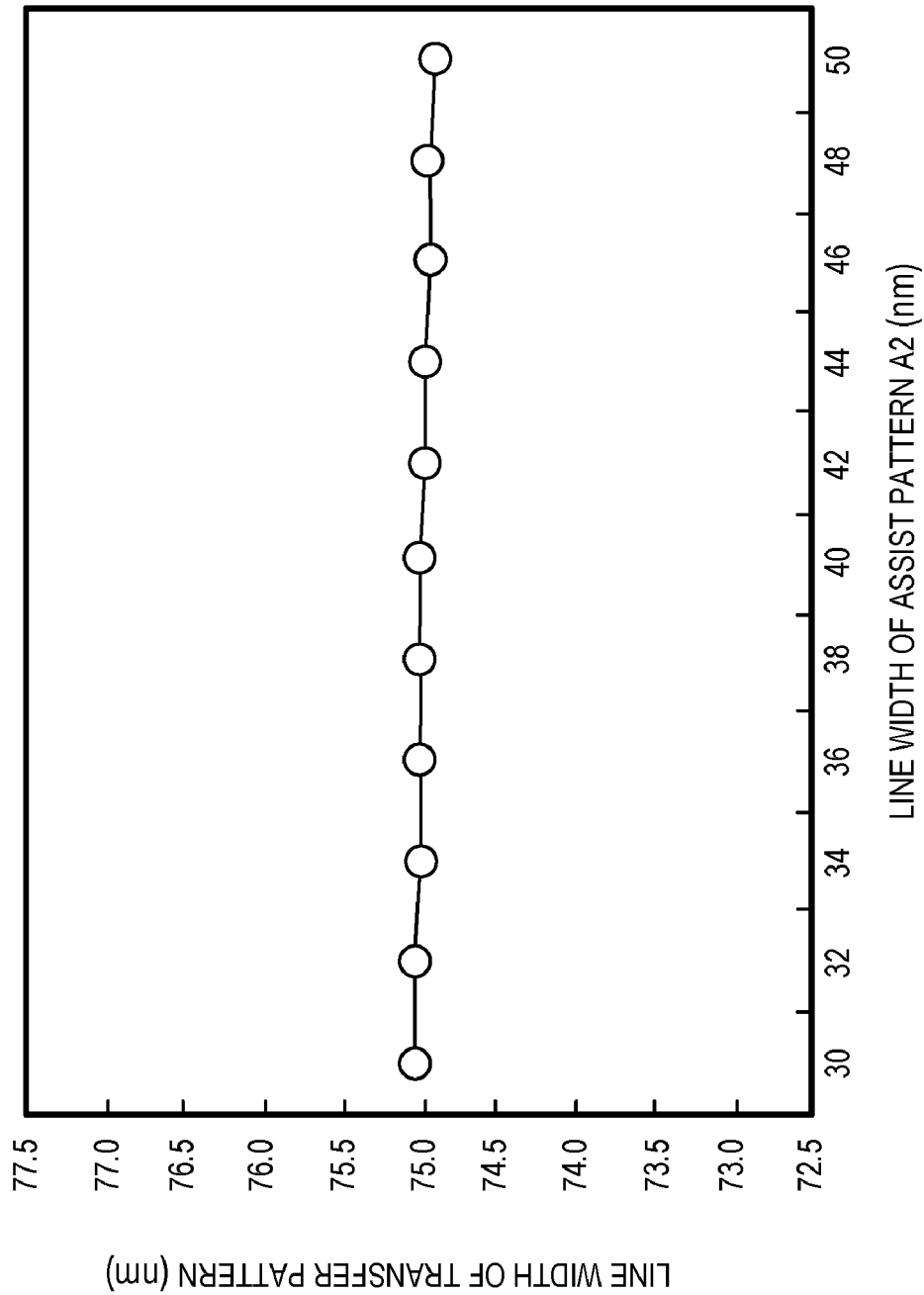
FIG. 6 shows a relationship between the line width of the assist pattern A2 and the line width of the transfer pattern.

FIG. 4 to FIG. 6 show results of optical simulation in which the line width (CD (Critical Dimension) value) of the device pattern (transfer pattern) transferred onto the wafer is obtained by changing the line width of each of the device pattern D and the assist patterns A1 and A2. Note that a target line width in the optical simulation is set to 75 nm.

FIG. 4 shows a relationship between the line width of the device pattern D and the line width of a transfer pattern. FIG. 5 shows a relationship between the line width of the assist pattern A1 and the line width of the transfer pattern. FIG. 6 shows a relationship between the line width of the assist pattern A2 and the line width of the transfer pattern.

FIG. 4 shows a relationship between the line width of the device pattern D and the line width of the transfer pattern of the device pattern D at the time when the optical simulation is performed by changing the edge position on one side of the device pattern D without changing the line width of the assist patterns A1 and A2. FIG. 5 shows a relationship between the line width of the assist pattern A1 and the line width of the transfer pattern of the device pattern D at the time when the optical simulation is performed by changing the line width of one side of the assist pattern A1 without changing the line width of the device pattern D, the assist pattern A2, and the other side of the assist patterns A1. FIG. 6 shows a relationship between the line width of the assist pattern A2 and the line width of the transfer pattern of the device pattern D at the time when the optical simulation is performed by changing the line width of one side of the assist pattern A2 without changing the line width of the device pattern D, the assist pattern A1, and the other one side of the assist pattern A2.

As shown in FIG. 4, when the line width of the device pattern D on the photomask is changed, the line width of the transfer pattern of the device pattern D is obviously increased or decreased according to the increase or decrease of the line width of the device pattern D. Further, it can be seen from FIG. 5 that the line width of the transfer pattern of the device pattern D can be changed by changing the line width of the assist pattern A1 on the photomask. For example, when the line width of the device pattern D on the photomask is increased by 1 nm to become 81 nm, it can be seen from FIG. 4 that the line width of the transfer pattern of the device pattern D obtained by the optical simulation becomes about 76.1 nm. When the same effect is intended to be obtained in the state where the line width of the device pattern D on the photomask is kept at 80 nm, it can be seen from FIG. 5 that the transfer pattern of the device pattern D, which has the line width of about 76.1 nm, can be obtained in such a way that the line width of the assist pattern A1 on the photomask is increased by 10 nm to become about 50 nm. On the other hand, it can be seen from FIG. 6 that the line width of the transfer pattern of the device pattern D is hardly changed even when the line width of the assist pattern A2 is changed.

It can be seen from FIG. 4 that when the line width of the device pattern D on the photomask is changed, the line width of the transfer pattern is significantly changed. This indicates that when a defect existing on the photomask is corrected, the correction accuracy is strictly required. Therefore, when a level difference exists at the edge of the device pattern and when a defect exists at the level difference, there is required a correction procedure capable of accurately reproducing the level difference.

On the other hand, as shown in FIG. 5, when the line width of the assist pattern A1 on the photomask is changed, the change in the line width of the transfer pattern of the device pattern D is comparatively moderate. This indicates that even when the line width of the assist pattern A1 is slightly changed, the effect of the change on the device pattern D is comparatively small. That is, it can be said that when a defect exists at the edge of the assist pattern A1, the correction accuracy of the defect is not so strictly required as in the case of the device pattern D.

For this reason, when one or more level differences formed at the edge of the device pattern by the OPC are intended to be eliminated or reduced, the shape change of the transfer pattern due to the elimination or reduction of the level differences at the edge of the device pattern is adjusted by changing the shape of the assist pattern arranged adjacent to the device pattern. Thereby, it is possible to form a device pattern on a photomask, the level difference of which is eliminated or reduced, and possible to facilitate the correction at the time when a defect is generated at the edge of the device pattern.

In the following, embodiments according to the present invention will be described.

First, a first embodiment will be described.

Figure 7:
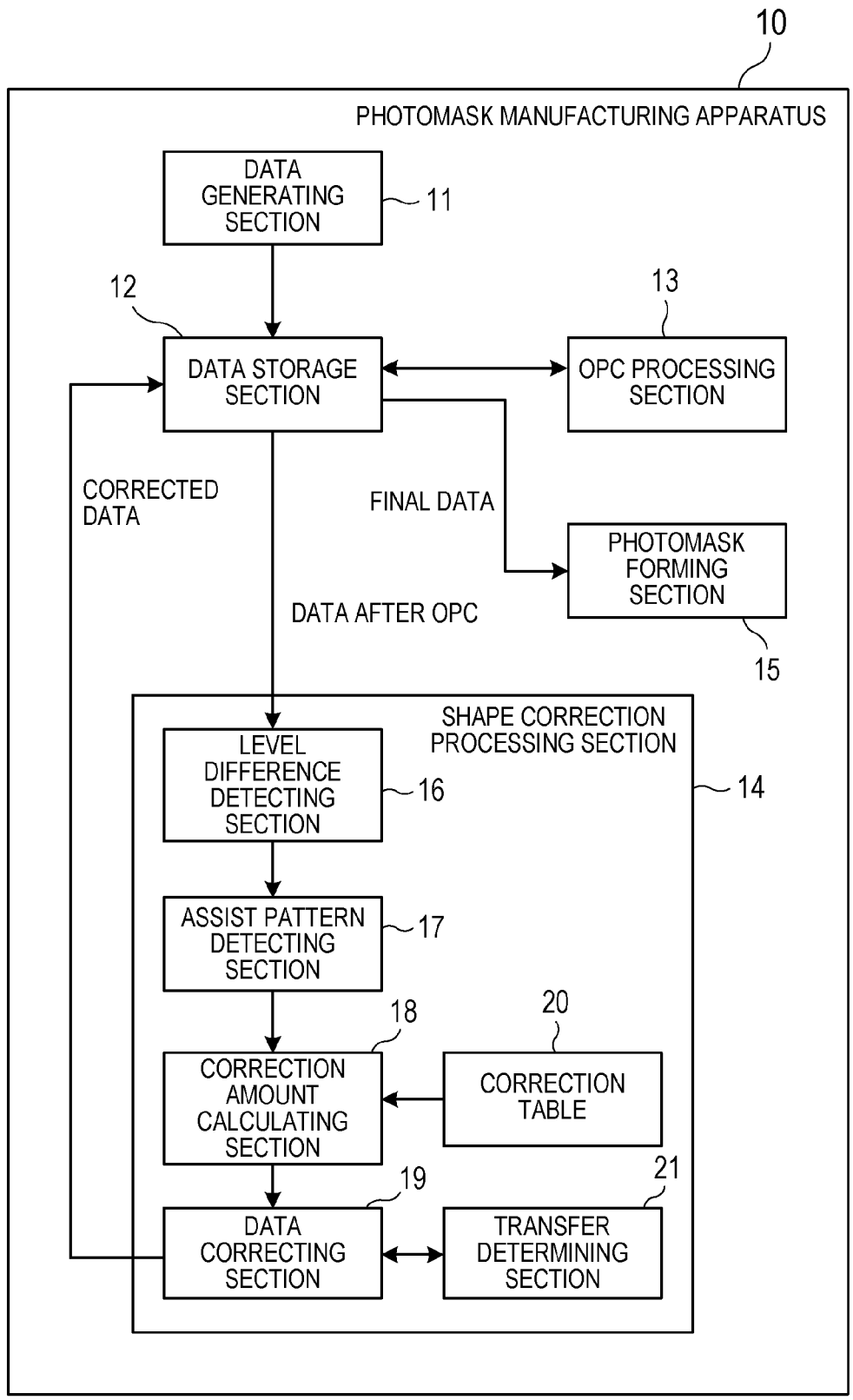
FIG. 7 shows a configuration example of a photomask manufacturing apparatus.

FIG. 7 shows a configuration example of a photomask manufacturing apparatus.

A photomask manufacturing apparatus 10 exemplified in FIG. 7 includes a data generating section 11, a data storage section 12, an OPC processing section 13, a shape correction processing section 14, and a photomask forming section 15.

The data generating section 11 generates data (original drawing data) representing the arrangement and shapes of all device patterns which are to be formed on a photomask. Further, the data generating section 11 generates, by using the original drawing data, data representing the arrangement and shapes of all assist patterns formed in the region in which the device patterns are not formed. The generated original drawing data and the generated assist pattern data are stored in the data storage section 12.

The OPC processing section 13 performs the OPC to the original drawing data which is generated by the data generating section 11 and is stored in the data storage section 12. The data of the device pattern having a level difference at the edge thereof is generated by the OPC. Note that the OPC processing section 13 may also be configured to be able to perform the OPC to the assist pattern data which is generated by data generating section 11 and is stored in the data storage section 12. Data after the OPC is stored in the data storage section 12.

The shape correction processing section 14 performs processing to correct the shapes of the device pattern and the assist pattern, on the basis of the shape change (level difference formation) caused at the edge of the device pattern by the OPC, by using the device pattern data after the OPC and the assist pattern data, each of which are stored in the data storage section 12. The data after the shape correction processing is stored in the data storage section 12.

Then, the photomask forming section 15 performs patterning of a predetermined base material by using the final data of the device pattern and the assist pattern which are corrected by the shape correction processing section 14, so as to form a photomask which is actually used for exposure.

Here, the shape correction processing section 14, which performs the shape correction processing of the device pattern after the OPC and the assist pattern, includes, for example as shown in FIG. 7, a level difference detecting section 16, an assist pattern detecting section 17, a correction amount calculating section 18, a data correcting section 19, a correction table 20, and a transfer determining section 21.

In this case, the level difference detecting section 16 detects a level difference which exists at the edge of the device pattern after the OPC, by using the device pattern data after the OPC stored in the data storage section 12.

The assist pattern detecting section 17 detects whether or not two or more assist patterns are arranged side by side so as to face the portion of the edge of the device pattern, at which portion the level difference detected by the level difference detecting section 16 exists. That is, the assist pattern detecting section 17 detects whether or not there are arranged an assist pattern adjacent to the edge side of the device pattern at which the detected level difference exists, and the other one or more assist patterns which sandwich the assist pattern together with the device pattern.

The correction amount calculating section 18 calculates a correction amount for changing the shape of the device pattern, in the vicinity of which the two or more assist patterns in the predetermined arrangement are detected by the assist pattern detecting section 17, and calculates a correction amount for changing the shape of the assist pattern adjacent to the device pattern. That is, the correction amount calculating section 18 calculates the edge position movement amount for eliminating the level difference at the edge of the device pattern and the line width change amount of the assist pattern corresponding to the edge position movement.

The correction table 20, which represents a relationship between the edge position movement amount of the device pattern and the line width change amount of the assist pattern, is configured so as to be used for the calculation of the correction amount in the correction amount calculating section 18. The contents of the correction table 20 are acquired beforehand in consideration of a configuration (arrangement and the like of the device pattern and the assist pattern) of the photomask to be formed and conditions of exposure performed by using the photomask.

The data correcting section 19 corrects the data of the device pattern after the OPC, and the data of the assist pattern by using the correction amount calculated by the correction amount calculating section 18. That is, the data correcting section 19 corrects the data of the device pattern into the data in which the edge position of the device pattern is moved by the correction amount, and corrects the data of the assist pattern into data in which the line width of the assist pattern is changed by the correction amount. The corrected data of the device pattern and the assist pattern are stored in the data storage section 12.

The transfer determining section 21 performs optical simulation in consideration of the conditions under which the exposure is actually performed by using the assist pattern data corrected by the data correcting section 19, and determines whether or not the assist pattern after the data correction is transferred. The data correcting section 19 can also be configured so as to send the data determined by the transfer determining section 21 to the photomask forming section 15.

Figure 8:
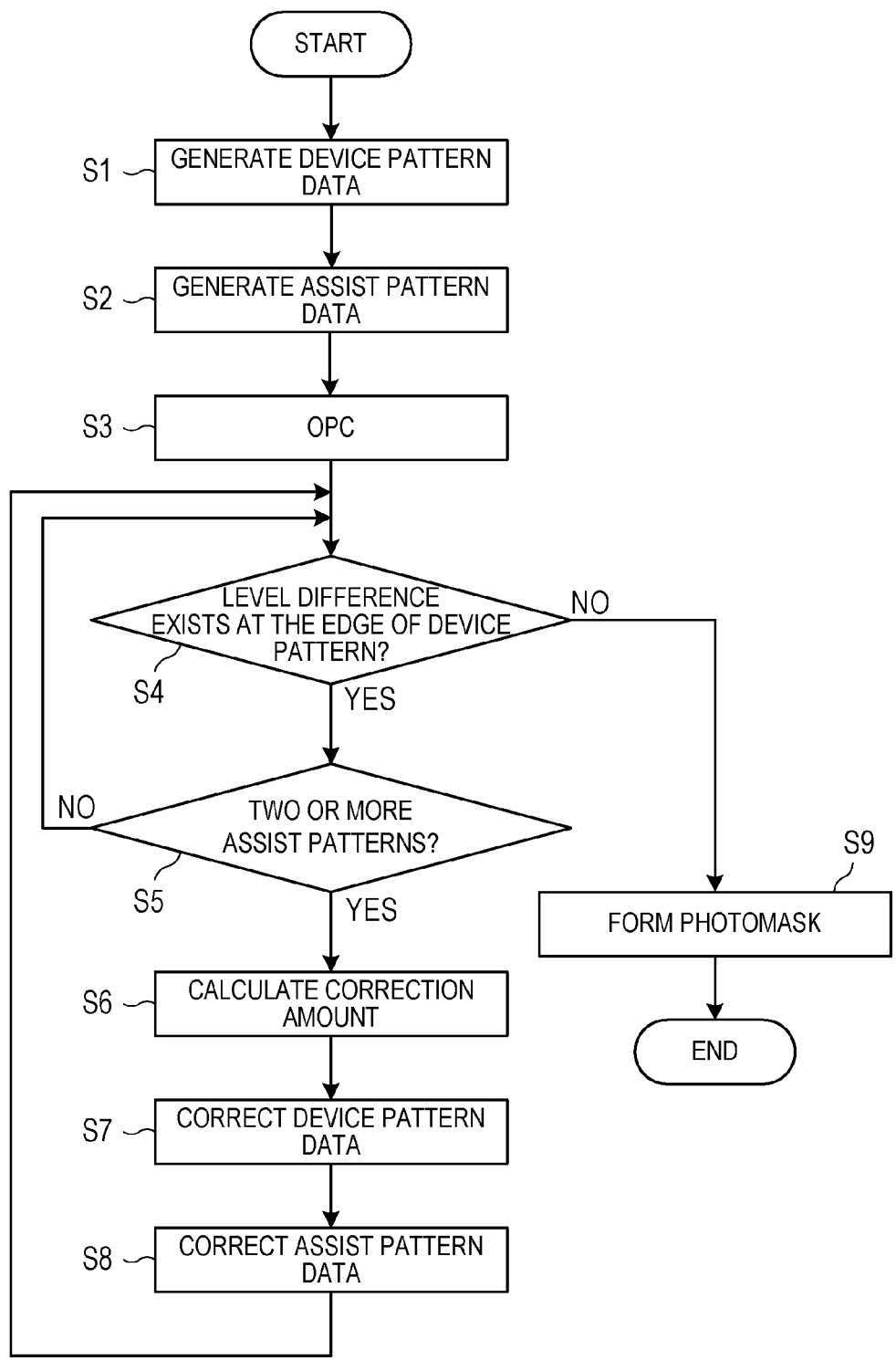
FIG. 8 shows an example of a flow chart for manufacturing the photomask.

Subsequently, there will be described an example of a flow chart for manufacturing the photomask by using the above described photomask manufacturing apparatus 10. FIG. 8 is a figure showing an example of a flow chart of a photomask manufacturing process.

First, data of all device patterns to be formed on a photomask are generated by the data generating section 11 (step S1). Further, data of all assist patterns to be formed on the photomask are generated by the data generating section 11 by using the data of the device patterns (step S2). Subsequently, the OPC is performed to the device patterns by the OPC processing section 13 (step S3). Data having a level difference at the edge of the device pattern is generated by the OPC. Then, the shape correction processing section 14 performs processing by using the data subjected to the OPC.

First, the level difference detecting section 16 detects a level difference which exists at the edge of the device pattern subjected to the OPC (step S4). At this time, when detecting the level difference for a certain specific device pattern, the assist pattern detecting section 17 detects whether or not two or more assist patterns are arranged side by side so as to face the edge at which the level difference exists (step S5).

In step S5, when the two or more assist patterns are detected, the correction amount calculating section 18 calculates correction amounts of the specific device pattern and the assist patterns adjacent to the device pattern (a movement amount of the edge position of the device pattern and a change amount of the line width of the assist patterns) by using the correction table 20 (step S6).

Further, when the two or more assist patterns are not detected in step S5, and when one assist pattern is detected, the detected level difference portion of the specific device pattern is not used as the object of the correction amount calculation in subsequent step S6. That is, the process is returned to step S4, and the processing of step S4 and subsequent steps is performed to the specific device pattern or another device pattern. This is because the line width of the assist pattern cannot be changed in correspondence with the elimination of the level difference, when no assist pattern exists on the side of the edge at which the level difference exists. Further, this is because when one assist pattern exists on the side of the edge at which the level difference exists, the change in the line width of the assist pattern may influence the transfer shape of a device pattern other than the specific device pattern set as the present object of the correction amount calculation.

The above described calculation of the correction amount by using the correction table 20 in step S6 can be performed, for example, as follows.

Figure 10:
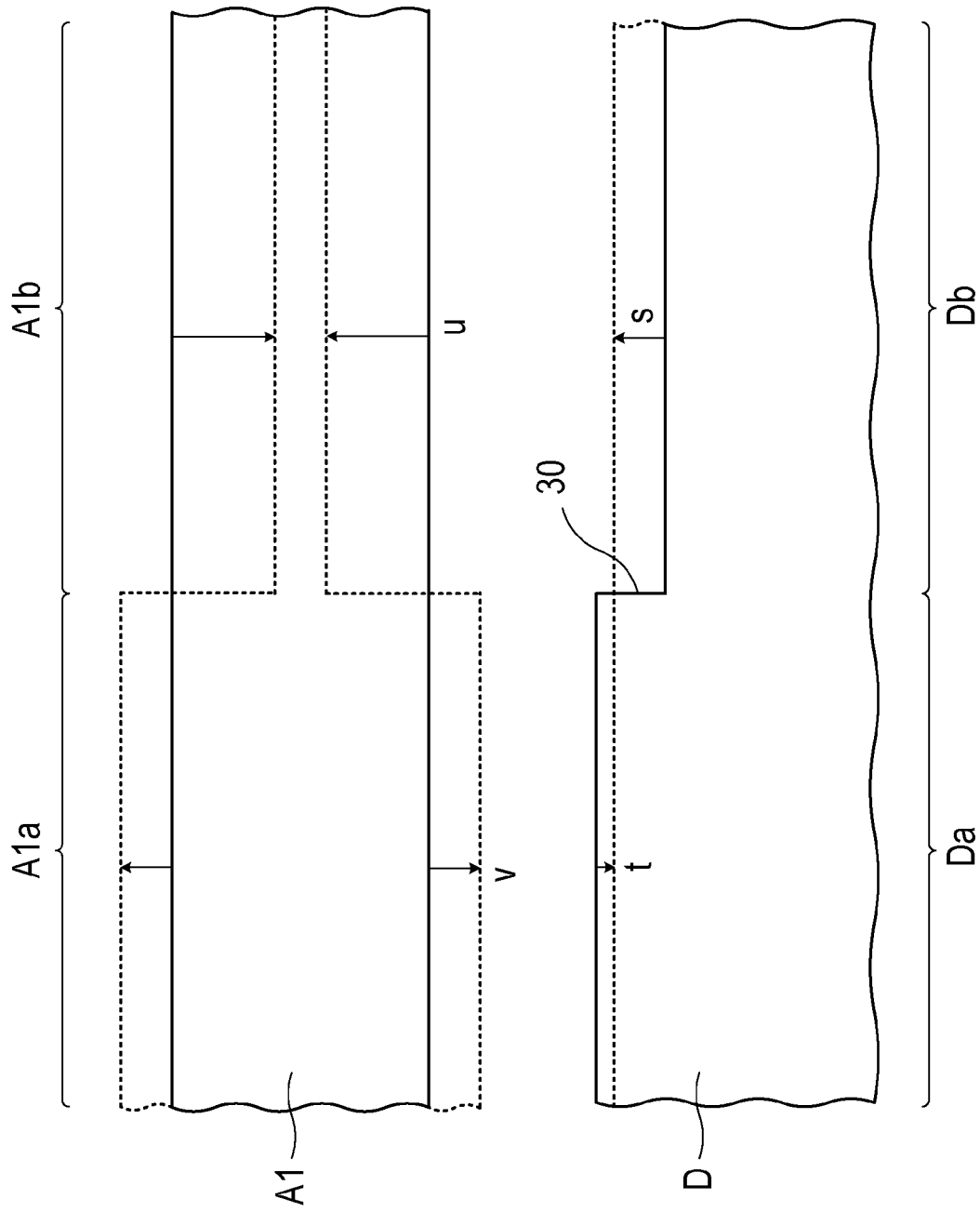
FIG. 10 is a figure for explaining calculation of correction amounts of the device pattern and the assist pattern.

FIG. 9 shows an example of the correction table. FIG. 10 is a figure for explaining the calculation of correction amounts of the device pattern and the assist pattern.

In FIG. 9, there is shown, for example, the correction table 20 acquired in the case where two linear shape assist patterns A1 and A2 having a line width of 40 nm are arranged on each of both sides of a linear device pattern D having a line width of 80 nm as shown in FIG. 3.

In the correction table 20, there are shown, for each size of the level difference formed at the edge of the device pattern D after the OPC, a relationship between the movement amount s of the edge position of the device pattern D in the direction toward the assist pattern A1 and the line width change amount u of the assist pattern A1 at the time when the edge position is moved in the direction, and a relationship between the movement amount t of the edge position of the device pattern D in the direction away from the assist pattern A1 and the line width change amount v of the assist pattern A1 at the time when the edge position is moved in the direction.

For example, there is assumed a case where a level difference 30 of 4 nm exists at the edge of the device pattern D after the OPC, as shown in FIG. 10. In this case, as shown by the dotted line in FIG. 10, by referring to the correction table 20, the edge of the projecting portion Da of the device pattern D is moved by 1 nm (t) in the direction away from the assist pattern A1, and the edge of the recessed portion Db of the device pattern D is moved by 3 nm (s) in the direction toward the assist pattern A1. Thereby, the level difference 30 of the device pattern D is eliminated.

Then, the line width of the assist pattern A1 is controlled so that a desired transfer shape pattern is formed on the wafer at the time of exposure using the device pattern D whose level difference 30 is eliminated. In this case, as shown by the dotted line in FIG. 10, the line width of the portion A1a of the assist pattern A1, facing the projecting portion Da of the device pattern D, is increased by 10 nm (v), and the line width of the portion A1b of the assist pattern A1, facing the recessed portion Db of the device pattern D, is reduced by 36 nm (u). In this case, the line width of the portion A1a facing the projecting portion Da is symmetrically increased by 5 nm for each side the portion A1a, while the line width of the portion A1b facing the recessed portion Db is symmetrically reduced by 18 nm for each side the portion A1b.

However, the range in which, in this way, the edge position of the device pattern D is moved and the line width of the assist pattern A1 is changed, is assumed to be limited in the region from the level difference 30 set as the present object to an adjacent level difference existing at the same edge, or in the region from the level difference 30 to the end of the adjacent assist pattern A1.

Figure 11:
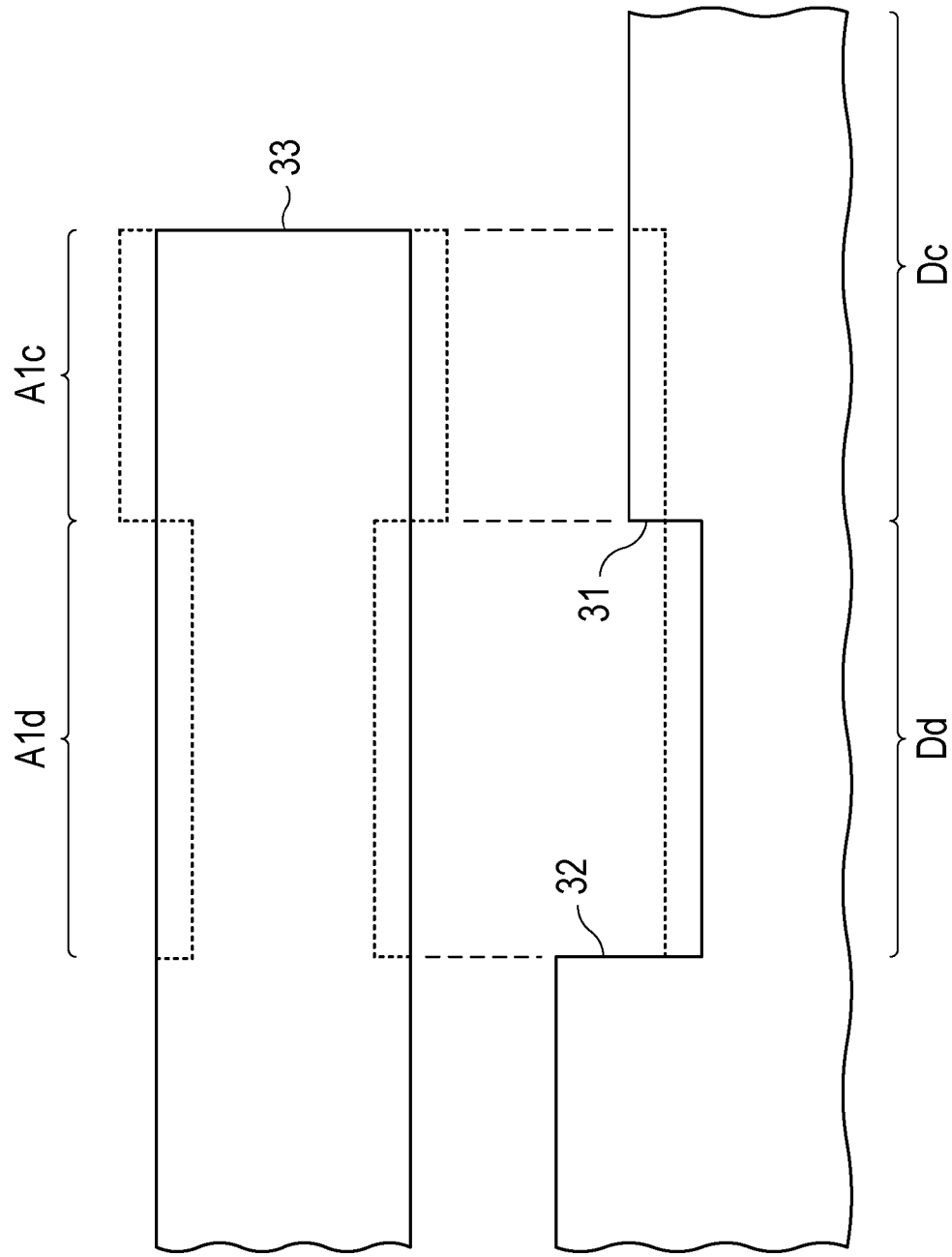
FIG. 11 is a figure for explaining ranges in which the edge position of the device pattern is moved and in which the line width of the assist pattern is changed.

FIG. 11 is a figure for explaining the ranges in which the edge position of the device pattern is moved and in which the line width of the assist pattern is changed.

FIG. 11 exemplifies a case where level differences 31 and 32 having different sizes exist at the edge of the device pattern D after the OPC. For example, in the case where the level difference 31 is intended to be eliminated, the edge position of the recessed portion Dd between the level difference 31 and the adjacent level difference 32 is moved by a predetermined amount on the basis of the correction table 20, as shown by the dotted line in FIG. 11. Further, the edge position of the projecting portion Dc between the level difference 31 and the end 33 of the assist pattern A1 is moved by a predetermined amount on the basis of the correction table 20, as shown by the dotted line in FIG. 11. The line width of the portions A1c and A1d of the assist pattern A1, which respectively face the above described ranges of the projecting portion Dc and the recessed portion Dd, is changed on the basis of the correction table 20, as shown by the dotted line in FIG. 11.

After the correction amounts of the specific device pattern and the assist pattern adjacent to the specific device pattern are calculated in step S6 shown in FIG. 8 as described in the above example, the data of the specific device pattern after the OPC and the data of the adjacent assist pattern are corrected by the data correcting section 19. That is, the edge position movement amount of the correction amount is used to correct the data of the specific device pattern after the OPC (step S7), and the line width change amount of the correction amount is used to correct the data of the adjacent assist pattern data (step S8).

After the data of the specific device pattern and of the assist pattern adjacent to the specific device pattern are corrected, the process is returned to step S4, and the processing from step S4 to step S8 is respectively performed for all the level differences which exist in the data of the device pattern after the OPC. Then, after the processing is performed for all the level differences, the finally obtained data of the device pattern and of the assist pattern are sent to the photomask forming section 15, so that a photomask is formed by the photomask forming section 15 (step S9). When the photomask is formed, it is possible to form, in the same configuration, the device pattern and the assist pattern in which the above described shape correction is reflected, and also possible to change the transmittance and reflectance for each of the patterns.

Figure 12:
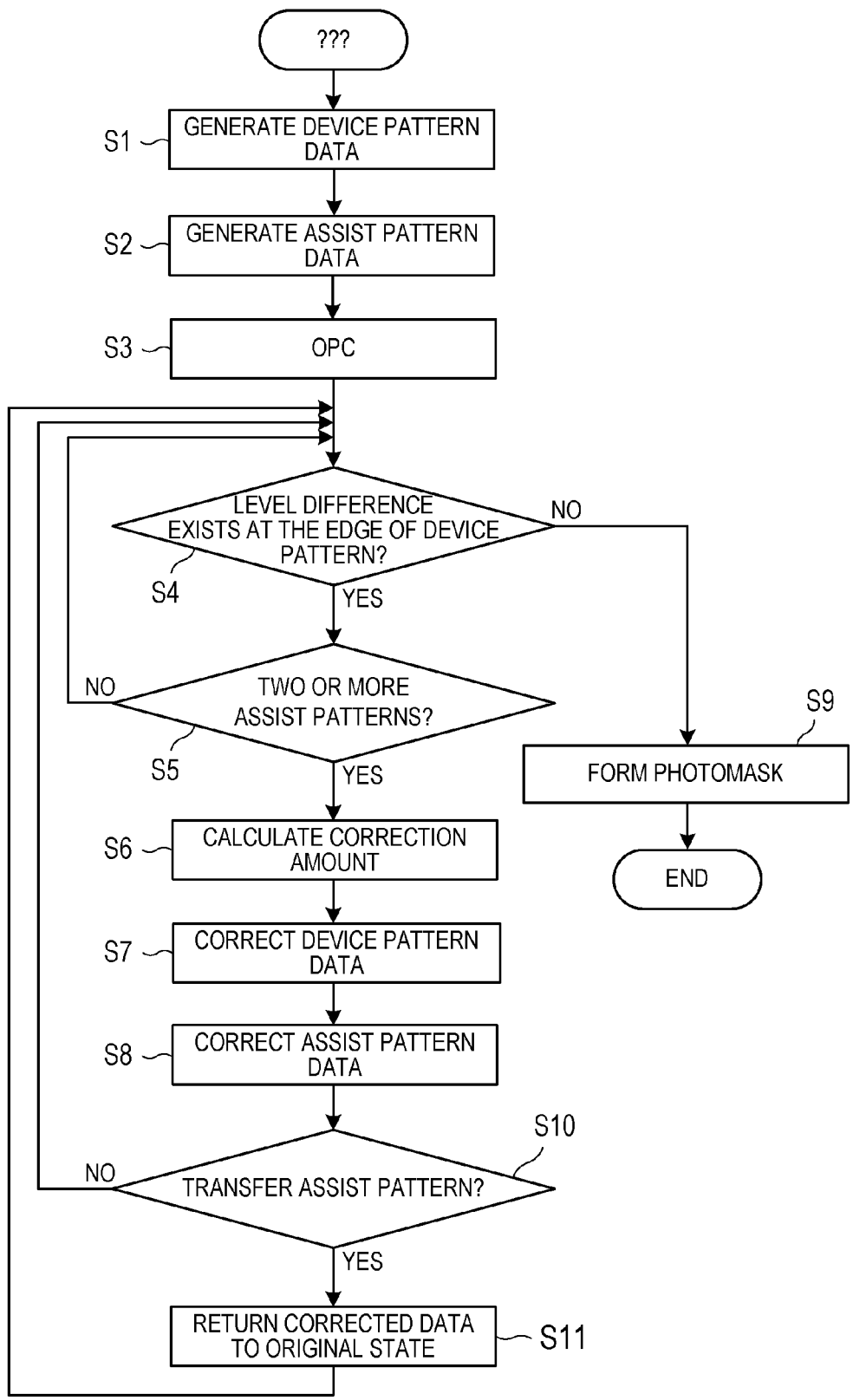
FIG. 12 is a figure showing another example of a flow chart for manufacturing the photomask.

The photomask can be manufactured according to the flow chart as shown in FIG. 8. Further, other than the flow chart shown in FIG. 8, the photomask can also be manufactured according to a flow chart as shown in FIG. 12 as follows. FIG. 12 is a figure showing another example of a flow chart for manufacturing the photomask.

Each of the processing contents in step S1 to step S9 in the flow chart shown in FIG. 12 is the same as that in the flow shown in FIG. 8. In the flow shown in FIG. 12, by using the data of the adjacent assist pattern corrected by the data correcting section 19 on the basis of the shape correction amount calculated by the correction amount calculating section 18 (step S6 to step S8), the transfer determining section 21 determines whether or not the corrected assist pattern is transferred onto the wafer (step S10).

Then, when it is determined that the corrected assist pattern is transferred onto the wafer, the shape correction performed for the level difference set as the present object, that is, the movement of the edge position of the specific device pattern and the correction of the line width of the adjacent assist pattern are stopped, so that the corrected data of the both patterns are returned to the original states before the shape correction (the states after the OPC) by the data correcting section 19 (step S11). Thereafter, the processing of step S4 and subsequent steps is performed to another level difference. Further, when it is determined that the corrected assist pattern is not transferred onto the wafer, the processing of step S4 and subsequent steps is performed to another level difference, without returning the performed shape correction to the original state.

The transferability of the assist pattern after the line width correction is taken into consideration when the correction table 20 is created, but the processes, such as step S10 and step S11 including the reconfirmation process after the correction, may also be added.

Subsequently, there will be described an application example of the procedure as described above.

Figure 13A:
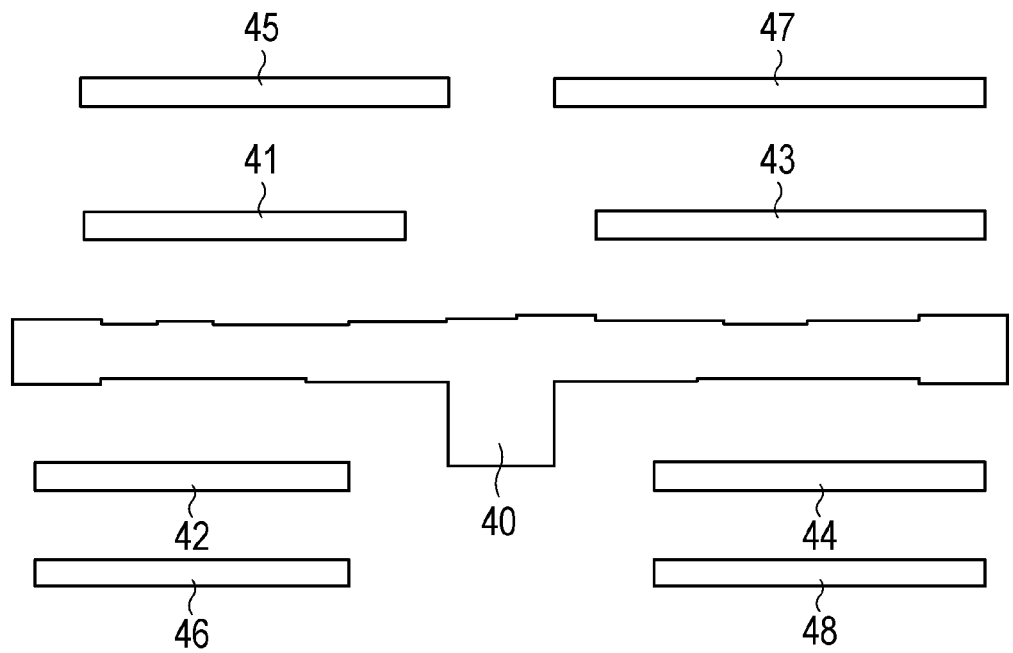
FIG. 13A and FIG. 13B are figures showing data after the OPC, in which figures
Figure 13B:
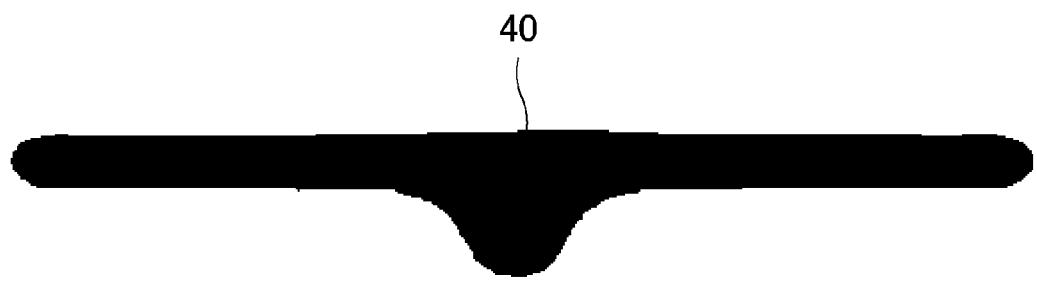
Figure 14A:
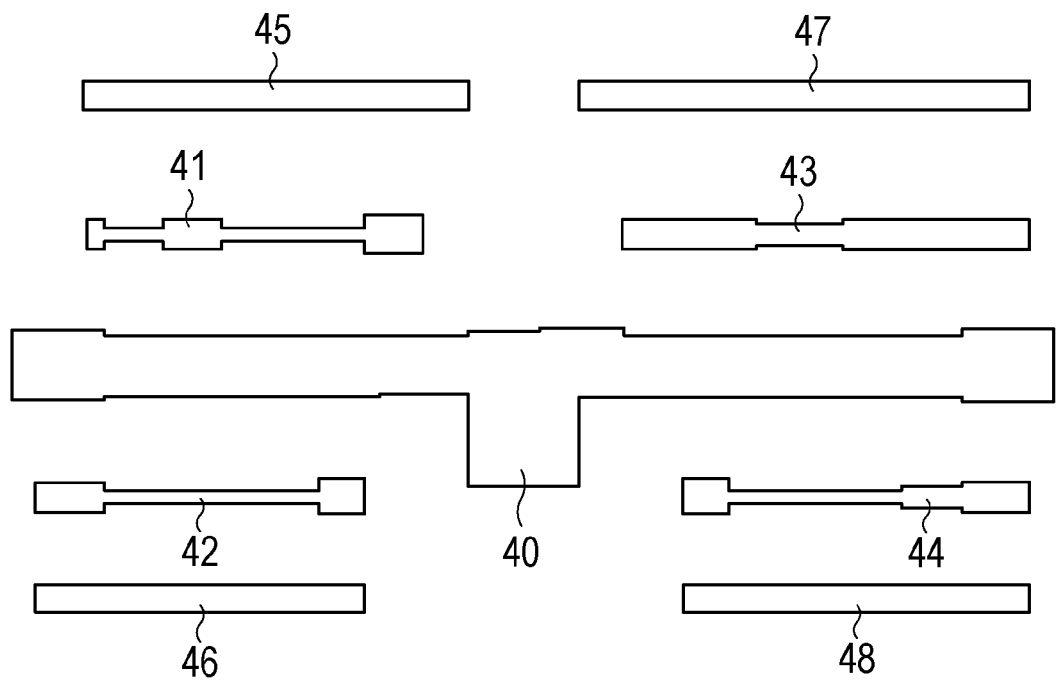
FIG. 14A and FIG. 14B are figures showing data after shape correction, in which figures

FIG. 13A shows data of a device pattern after the OPC and data of an assist pattern, and FIG. 13B shows an optical simulation result of FIG. 13A. FIG. 14A shows data of the device pattern and data of the assist pattern after the shape correction, and FIG. 14B shows an optical simulation result of FIG. 14A.

As shown in FIG. 13A, when the OPC is performed to a device pattern 40, many minute level differences of about several nanometers are formed at the edge of the device pattern 40. The OPC is not performed to the assist patterns 41 to 48, and hence the level difference is not formed at the edge of the assist patterns.

FIG. 14A shows a result obtained by performing the above described shape correction processing by using the data of the device pattern 40 after the OPC and of the assist patterns 41 to 48 as shown in FIG. 13A. As shown in FIG. 14A, it can be seen that the level differences formed at the edge of the device pattern 40 by the OPC are eliminated, and that the edges of the device pattern 40 are made linear and the number of remaining level differences is reduced. On the other hand, among the assist patterns 41 to 48, the line width of the assist patterns 41 to 44 adjacent to the device pattern 40 is changed.

Figure 14B:
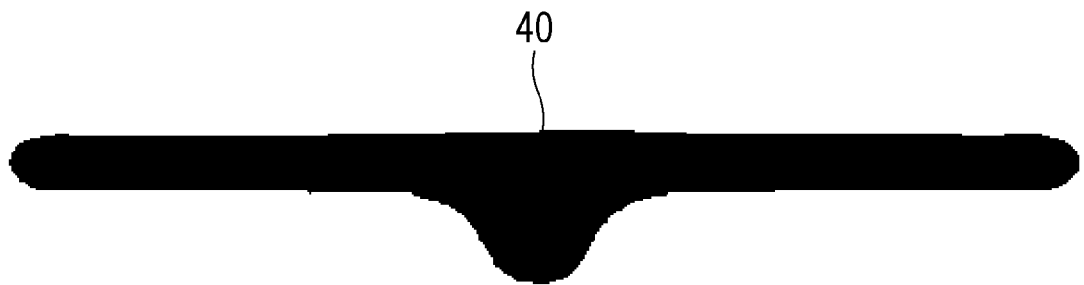

When the results of optical simulation performed by using the data of the respective patterns shown in FIG. 13A and FIG. 14A are compared, a conspicuous difference cannot be recognized between the transfer shapes of the device patterns 40 as shown in FIG. 13B and FIG. 14B. Further, the size difference between both the transfer shapes is preferably 1 nm or less.

Note that in the above description, numerical values of the level difference are set in a step of 1 nm in the correction table 20, but the numerical value may also be changed, provided that the steps can be more finely set by a data grid. Further, when the contents of the correction table 20 are acquired, the correction amount for eliminating the level difference of the device pattern can be arbitrarily allocated in a range which can be covered by the line width correction of the assist pattern. However, it should be noted that the assist pattern must not be transferred onto the wafer.

Next, a second embodiment will be described.

Figure 15:
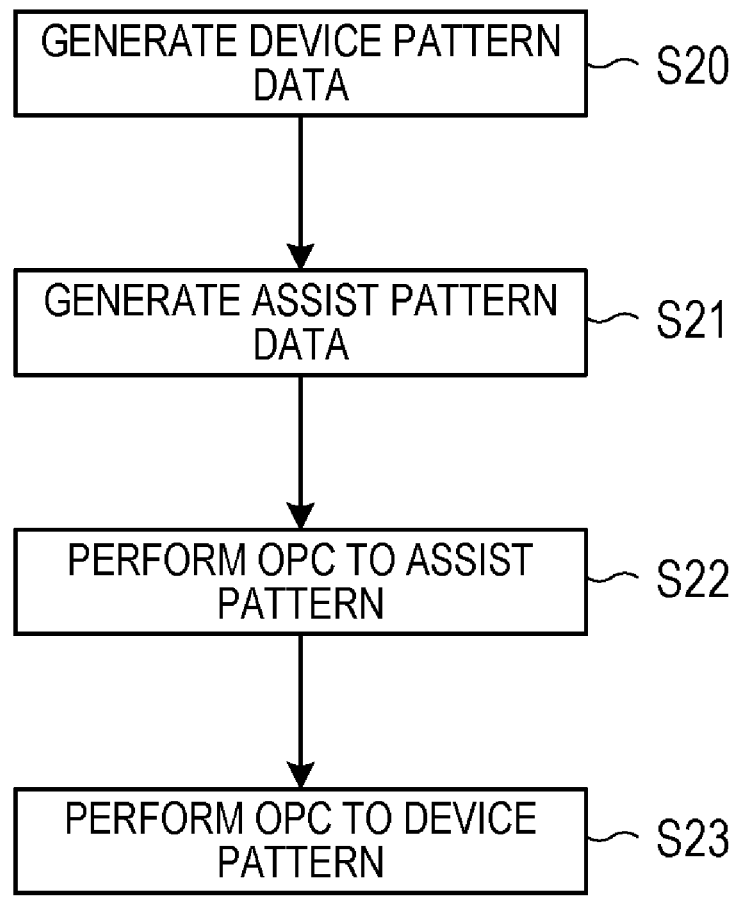
FIG. 15 shows an example of a flow chart of data processing from the generation of the device pattern to the OPC.

FIG. 15 shows an example of a flow chart of data processing from the device pattern generation to the OPC.

In the above described first embodiment, for example as shown in FIG. 8, after original drawing data of the device pattern and the assist pattern are generated (step S1 and S2), the OPC is performed to the data of the device pattern (step S3). Usually, the data of the device pattern and of the assist pattern are configured in a hierarchical structure. For example, the data of the assist pattern are generated in a hierarchy different from that of the data of the device pattern, so that the hierarchy of the data of the assist pattern is prevented from being subjected to the OPC.

On the other hand, in the second embodiment, as shown in FIG. 15, after the original drawing data of the device pattern and the data of the assist pattern are generated (steps S20 and S21), the OPC is first performed to the data of the assist pattern (step S22), and then, the OPC is performed to the data of the device pattern (step S23).

In this way, the line width correction of the assist pattern is previously performed by the OPC on the basis of the device pattern before the OPC, and then the OPC is performed to the data of the device pattern in consideration of the data of the assist pattern after the OPC. Thereby, it is possible to obtain the data of the device pattern having no level difference or having a small number of level differences.

After the data of the assist pattern after the OPC and the data of the device pattern after the OPC are acquired in this way, it is preferred to perform the same processing as the processing of step S4 and subsequent steps shown in FIG. 8, by using the acquired data. That is, after the processing in step S23, there is performed the shape correction processing for eliminating the level differences which still remain at the edge of the device pattern, and for changing the line width of the corresponding assist pattern. Thereby, it is possible to more accurately eliminate or reduce the level difference of the device pattern. Further, in this case, it is also possible to add the processing of step S10 and step S11 as shown in FIG. 12.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed:

1. A photomask manufacturing method comprising:

generating data of a main pattern to be transferred onto a substrate, and data of an assist pattern which is arranged adjacent to the main pattern and which assists the transfer of the main pattern without being transferred onto the substrate;

performing optical proximity effect correction to the generated data of the main pattern, wherein corrected main pattern includes a first edge and a second edge, both the first edge and the second edge elongate to a first direction, the first edge faces to a first portion of a third edge of the assist pattern, and the second edge faces to a second portion of the third edge;

correcting shapes of the main pattern and of the assist pattern on the basis of a shape change caused at an edge of the main pattern facing the assist pattern by the optical proximity effect correction; and forming a photomask by using the corrected data of the main pattern and of the assist pattern, wherein the process of correcting the shapes includes:

detecting a level difference planarly between the first edge and the second edge; and moving at least one of the first edge and the second edge to a second direction perpendicular to the first direction in order to eliminate the level difference;

moving at least one of the first portion of the third edge and the second portion of the third edge to the second direction, so as to enable the first edge and the second edge to be linearly transferred onto the substrate.

2. The photomask manufacturing method according to claim 1, wherein the correction amount of the width of the assist pattern is calculated by using a previously set relationship between a correction amount of the edge position and a correction amount of the width of the assist pattern.

3. The photomask manufacturing method according to claim 1, further comprising:

detecting, after the level difference is detected, the existence of another assist pattern which is arranged so as to be sandwiched by the assist pattern with the main pattern; and calculating, when the another assist pattern exists, the correction amount of the edge position of the main pattern and the correction amount of the width of the assist pattern on the basis of the correction amount of the edge position of the main pattern.

4. The photomask manufacturing method according to claim 1, further comprising:

a process of determining, after the process of correcting the shapes, whether or not the corrected assist pattern is transferred onto the substrate;

wherein the process of forming the photomask forms the photomask by using the data of the corrected assist pattern which is determined not to be transferred.

5. The photomask manufacturing method according to claim 1, further comprising:

a process of performing the optical proximity effect correction to the data of the assist pattern, after the process of generating the data of the main pattern and of the assist pattern, and before the process of performing the optical proximity effect correction to the data of the main pattern, wherein the process of performing the optical proximity effect correction to the data of the main pattern is performed by using the result of the optical proximity effect correction to the assist pattern.

* * * * *